(12) United States Patent
Chen (10) Patent No.: US 10,734,200 B2
(45) Date of Patent: *Aug. 4, 2020

(54) MONO-ENERGETIC NEUTRAL BEAM ACTIVATED CHEMICAL PROCESSING SYSTEM AND METHOD OF USING

(71) Applicant: TOKYO ELECTRON LIMITED, Tokyo (JP)

(72) Inventor: Lee Chen, Cedar Creek, TX (US)

(73) Assignee: TOKYO ELECTRON LIMITED, Tokyo (JP)

( * ) Notice: Subject to any disclaimer, the term of this patent is extended or adjusted under 35 U.S.C. 154(b) by 498 days.

This patent is subject to a terminal disclaimer.

(21) Appl. No.: 15/352,339

(22) Filed: Nov. 15, 2016

(65) Prior Publication Data

US 2017/0062188 A1    Mar. 2, 2017

Related U.S. Application Data

(63) Continuation of application No. 12/053,008, filed on Mar. 21, 2008, now Pat. No. 9,520,275.

(51) Int. Cl.
*C23C 16/00* (2006.01)
*H01L 21/326* (2006.01)
(Continued)

(52) U.S. Cl.
CPC ...... *H01J 37/32357* (2013.01); *H01J 37/321* (2013.01); *H01J 37/32027* (2013.01);
(Continued)

(58) Field of Classification Search
CPC ............... H01J 37/321; H01J 37/3211; H01J 37/32119; H01J 37/32128;
(Continued)

(56) References Cited

U.S. PATENT DOCUMENTS 4,496,448 A * 1/1985 Tai ............... H01J 37/32082
204/192.32
5,350,480 A    9/1994 Gray
(Continued)

FOREIGN PATENT DOCUMENTS

JP    7-221068      8/1995
JP    2005-514762 A    5/2005

OTHER PUBLICATIONS

Office Action dated Jul. 21, 2015 in Korean Patent Application No. 10-2010-7023351 (with English Translation).
(Continued)

*Primary Examiner* — Luz L Alejandro Mulero
(74) *Attorney, Agent, or Firm* — Oblon, McClelland, Maier & Neustadt, L.L.P.

(57) ABSTRACT

A chemical processing system and a method of using the chemical processing system to treat a substrate with a mono-energetic space-charge neutralized neutral beam-activated chemical process is described. The chemical processing system comprises a first plasma chamber for forming a first plasma at a first plasma potential, and a second plasma chamber for forming a second plasma at a second plasma potential greater than the first plasma potential, wherein the second plasma is formed using electron flux from the first plasma. Further, the chemical processing system comprises a substrate holder configured to position a substrate in the second plasma chamber.

20 Claims, 6 Drawing Sheets

(51) Int. Cl.
   *H01J 37/32*      (2006.01)
   *H01L 21/3065*    (2006.01)
(52) U.S. Cl.
   CPC ...... *H01J 37/3244* (2013.01); *H01J 37/3255* (2013.01); *H01J 37/32091* (2013.01); *H01J 37/32192* (2013.01); *H01J 37/32422* (2013.01); *H01J 2237/3341* (2013.01); *H01L 21/3065* (2013.01)
(58) Field of Classification Search
   CPC ........... H01J 37/32137; H01J 37/32146; H01J 37/32155; H01J 37/32165; H01J 37/32174; H01J 37/32183; H01J 37/32027; H01J 37/32357; H01J 37/32422; H01J 37/32082; H01J 37/32091
   See application file for complete search history.

(56) References Cited

U.S. PATENT DOCUMENTS

| | | | |
|---|---|---|---|
| 5,468,955 A | | 11/1995 | Chen et al. |
| 5,888,414 A | * | 3/1999 | Collins ................. C23C 16/517 156/345.48 |
| 5,976,259 A | | 11/1999 | Yamazaki |
| 6,083,363 A | * | 7/2000 | Ashtiani ........... H01J 37/32357 204/298.01 |
| 6,167,835 B1 | | 1/2001 | Ootera et al. |
| 6,203,657 B1 | * | 3/2001 | Collison ............... H01J 37/321 118/723 IR |
| 6,352,049 B1 | | 3/2002 | Yin et al. |
| 7,922,880 B1 | * | 4/2011 | Pradhan ................ C23C 14/351 118/723 E |
| 2002/0005252 A1 | | 1/2002 | Masuda et al. |
| 2003/0052087 A1 | | 3/2003 | Kwon et al. |
| 2004/0082187 A1 | | 4/2004 | Chistyakov |
| 2006/0066247 A1 | * | 3/2006 | Koshiishi .......... H01J 37/32018 315/111.21 |
| 2007/0069118 A1 | | 3/2007 | Economou et al. |
| 2008/0026488 A1 | * | 1/2008 | Panda ............... H01J 37/32935 438/9 |
| 2009/0095714 A1 | | 4/2009 | Chen et al. |

OTHER PUBLICATIONS

Japanese Office Action issued in counterpart patent application JP 2011-500969, dated Sep. 24, 2013.
Office Action dated Mar. 24, 2014 in Chinese Patent Application No. 200980110185.9 (with English language translation).
Japanese Office Action issued in counterpart patent application JP 2011-500969, dated Feb. 26, 2013. All prior art references cited therein were listed in previously submitted Information Disclosure Statements or cited by the Examiner, in the present application.
Chinese Office Action issued in counterpart patent application CN 2009801101859, dated Mar. 5, 2013. All prior art references cited therein were listed in previously submitted Information Disclosure Statements in the present application.
Chinese Office Action issued in counterpart patent application CN 2009801101859, dated Aug. 20, 2013. All prior art references cited therein were listed in previously submitted Information Disclosure Statements in the present application, or were previously cited by the Examiner.
Taiwanese Office Action issued in counterpart patent application TW98109152, dated Jul. 15, 2013. All prior art references cited therein were listed in previously submitted Information Disclosure Statements in the present application, or were previously cited by the Examiner.
Chinese Office Action issued in counterpart patent application CN 2009801101859, dated Apr. 5, 2012. All prior art references cited therin were listed in previously submitted Information Disclosure Statements in the present application.
International Searching Authority, International Search Report and Written Opinion, International Application No. PCT/US09/37736, dated May 5, 2009, 8 pages.

* cited by examiner

MONO-ENERGETIC NEUTRAL BEAM ACTIVATED CHEMICAL PROCESSING SYSTEM AND METHOD OF USING

CROSS-REFERENCE TO RELATED APPLICATIONS

The present application is a continuation of U.S. patent application Ser. No. 12/053,008, filed Mar. 21, 2008. The entire contents of each of which are incorporated herein by reference.

BACKGROUND OF THE INVENTION

Field of the Invention

The invention relates to a method and system for treating a substrate and, more particularly, to a method and system for performing neutral beam activated chemical processing of a substrate.

Description of Related Art

During semiconductor processing, plasma is often utilized to assist etch processes by facilitating the anisotropic removal of material along fine lines or within vias (or contacts) patterned on a semiconductor substrate. Examples of such plasma assisted etching include reactive ion etching (RIE), which is in essence an ion activated chemical etching process.

However, although RIE has been in use for decades, its maturity is accompanied by several issues including: (a) broad ion energy distribution (IED), (b) various charging-induced side effects; and (c) feature-shape loading effects (i.e., micro loading). One approach to alleviate these problems is to utilize neutral beam processing.

A true neutral beam process takes place essentially without any neutral thermal species participating as the chemical reactant, additive, and/or etchant. The chemical process, such as an etching process, at the substrate is activated by the kinetic energy of the incident (directionally energetic) neutral species and the incident (directionally energetic and reactive) neutral species also serve as the reactants or etchants.

One natural consequence of neutral beam processing is the absence of micro loading since the process does not involve the effect of flux-angle variation associated with the thermal species (which serve as the etchants in RIE). However, an adverse consequence of the lack of micro loading is the achievement of an etch efficiency of unity, i.e., the maximum etching yield is unity, or one incident neutral nominally prompts only one etching reaction. Conversely, the abundant thermal neutral species (the etchant) in RIE can all participate in the etching of the film, with the activation by one energetic incident ion. Kinetic energy activated (thermal neutral species) chemical etching can therefore achieve an etch efficiency of 10, 100 and even 1000, while being forced to live with micro loading.

While many attempts have been made to cure these shortcomings, i.e., etch efficiency, micro loading, charge damage, etc., they still remain and the etch community continues to explore novel, practical solutions to this problem.

SUMMARY OF THE INVENTION

The invention relates to a method and system for treating a substrate and, more particularly, to a method and system for performing neutral beam activated chemical processing of a substrate.

Furthermore, the invention relates to a chemical processing system and method for treating a substrate with a space-charge neutralized neutral beam activated chemical process. The chemical processing system comprises a first plasma chamber for forming a first plasma at a first plasma potential, and a second plasma chamber for forming a second plasma at a second plasma potential greater than the first plasma potential, wherein the second plasma is formed using electron flux from the first plasma. Further, the chemical processing system comprises a substrate holder configured to position a substrate in the second plasma chamber.

According to one embodiment, a chemical processing system configured to treat a substrate is described, comprising: a plasma generation chamber comprising a first plasma region configured to receive a first process gas at a first pressure; process chamber comprising a second plasma region disposed downstream of the first plasma region and configured to receive the first process gas from the first plasma region at a second pressure; a first gas injection system coupled to the plasma generation chamber and configured to introduce the first process gas to the first plasma region; a plasma generation system coupled to the plasma generation chamber and configured to generate a first plasma at a first plasma potential in the first plasma region from the first process gas; a separation member disposed between the first plasma region and the second plasma region, wherein the separation member comprises one or more openings configured to allow an electron flux from the first plasma region to the second plasma region to form a second plasma at a second plasma potential; a bias electrode system coupled to the process chamber and configured to elevate the second plasma potential above the first plasma potential in order to control the electron flux; a substrate holder coupled to the process chamber and configured to support the substrate proximate the second plasma region; and a vacuum pumping system coupled to the process chamber and configured to pump the second plasma region in the process chamber.

According to another embodiment, a method for treating a substrate is described, comprising: disposing the substrate in a process chamber configured to treat the substrate; forming a first plasma in a first plasma region at a first plasma potential; forming a second plasma in a second plasma region at a second plasma potential using electron flux from the first plasma region; elevating the second plasma potential above the first plasma potential to control the electron flux; controlling a pressure in the process chamber; and exposing the substrate to the second plasma.

DETAILED DESCRIPTION OF EXEMPLARY EMBODIMENTS

In the following description, to facilitate a thorough understanding of the invention and for purposes of explanation and not limitation, specific details are set forth, such as a particular geometry of the plasma processing system and various descriptions of the system components. However, it should be understood that the invention may be practiced with other embodiments that depart from these specific details.

Nonetheless, it should be appreciated that, contained within the description are features which, notwithstanding the inventive nature of the general concepts being explained, are also of an inventive nature.

According to one embodiment, a method and system for performing neutral beam activated chemical processing of a substrate is provided, inter alia, to alleviate some or all of the above identified issues. Neutral beam activated chemical processing includes kinetic energy activation (i.e., thermal neutral species) and, hence, it achieves high reactive or etch efficiency. However, neutral beam activated chemical processing, as provided herein, also achieves mono-energetic activation, space-charge neutrality, and hardware practicality.

Figure 1A:
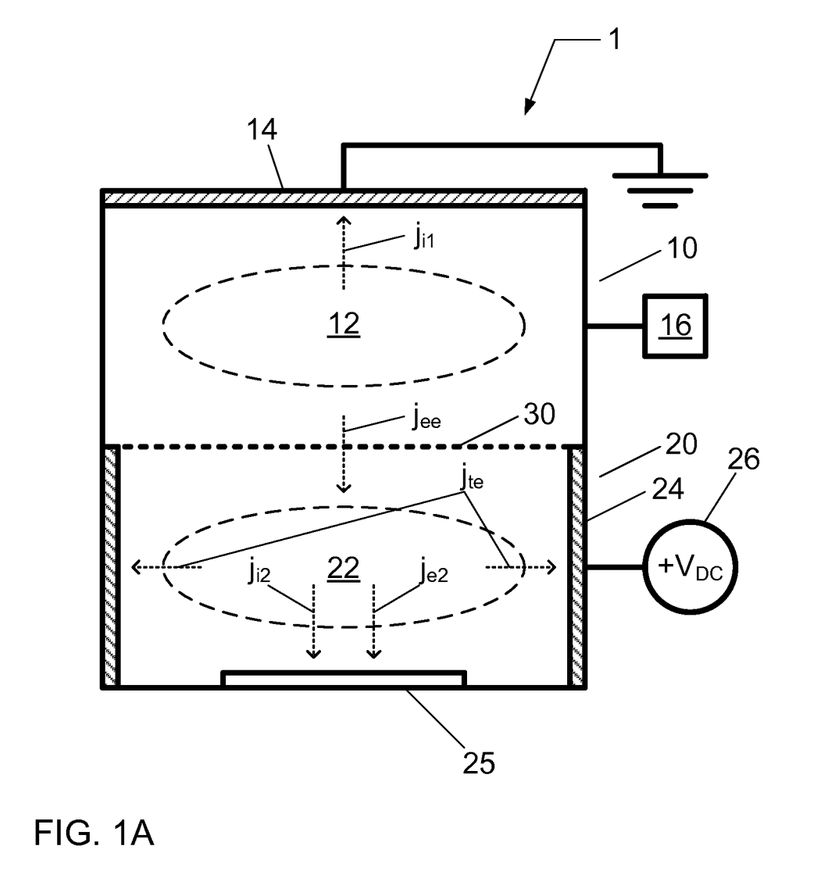
FIG. 1A shows a chemical processing system according to an embodiment.
Figure 1B:
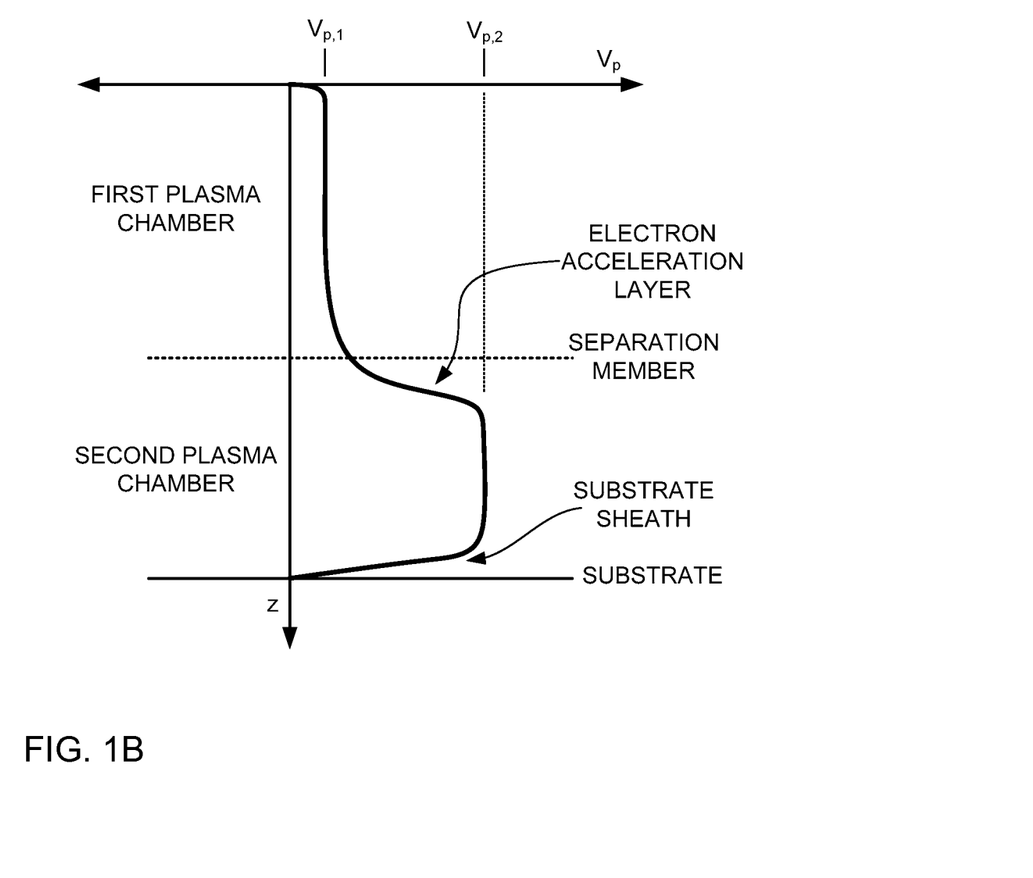
FIG. 1B illustrates conditions for a chemical process to be performed in the chemical processing system depicted in FIG. 1A.

Referring now to the drawings, wherein like reference numerals designate identical or corresponding parts throughout the several views, FIGS. 1A and 1B depict simplified schematics of a chemical processing system according to an embodiment. As shown in FIG. 1A, a chemical processing system 1 is described that is configured to perform space-charge neutralized neutral beam activated chemical processing of a substrate.

As illustrated in FIGS. 1A and 1B, the chemical processing system 1 comprises a first plasma chamber 10 for forming a first plasma 12 at a first plasma potential ($V_{p,1}$), and a second plasma chamber 20 for forming a second plasma 22 at a second plasma potential ($V_{p,2}$) greater than the first plasma potential. The first plasma 12 is formed by coupling power, such as radio frequency (RF) power, to an ionizable gas in the first plasma chamber 10, while the second plasma 22 is formed using electron flux (e.g., energetic electron (ee) current, $j_{ee}$) from the first plasma 12. Further, the chemical processing system 1 comprises a substrate holder configured to position a substrate 25 at direct current (DC) ground or floating ground in the second plasma chamber 20 to be exposed to the second plasma 22 at the second plasma potential.

The first plasma chamber 10 comprises a plasma generation system 16 configured to ignite and heat the first plasma 12. The first plasma 12 may be heated by any conventional plasma generation system including, but not limited to, an inductively coupled plasma (ICP) source, a transformer coupled plasma (TCP) source, a capacitively coupled plasma (CCP) source, an electron cyclotron resonance (ECR) source, a helicon wave source, a surface wave plasma source, a surface wave plasma source having a slotted plane antenna, etc. Although the first plasma 12 may be heated by any plasma source, it is desired that the first plasma 12 is heated by a method that produces a reduced or minimum fluctuation in its plasma potential $V_{p,1}$. For example, an ICP source is a practical technique that produces a reduced or minimum $V_{p,1}$ fluctuation.

Additionally, the first plasma chamber 10 comprises a direct current (DC) conductive electrode 14 having a conductive surface that acts as a boundary in contact with the first plasma 12. The DC conductive ground electrode 14 is coupled to DC ground. The DC conductive ground electrode 14 acts as an ion sink that is driven by the first plasma 12 at the first plasma potential ($V_{p,1}$). Although one DC conductive ground electrode 14 is shown in FIG. 1A, the chemical processing system 1 may comprise one or more DC conductive ground electrodes.

Although not necessary, it is desirable that the DC conductive ground electrode 14 comprises a relatively large area in contact with the first plasma 12. The larger the area at DC ground, the lower the first plasma potential. For example, the surface area of the conductive surface for the DC conductive ground electrode 14 in contact with the first plasma 12 may be greater than any other surface area in contact with the first plasma 12. Additionally, for example, the surface area of the conductive surface for the DC conductive ground electrode 14 in contact with the first plasma 12 may be greater than the total sum of all other conductive surfaces that are in contact with the first plasma 12. Alternatively, as an example, the conductive surface for the DC conductive ground electrode 14 in contact with the first plasma 12 may be the only conductive surface that is in contact with the first plasma 12. The DC conductive ground electrode 12 may offer the lowest impedance path to ground.

As described above, (energetic) electron flux (or electron current $j_{ee}$) from the first plasma 12 initiates and sustains the second plasma 22 in the second plasma chamber 20. In order to control the electron flux and produce a mono-energetic space-charge neutralized neutral beam, the first plasma potential ($V_{p,1}$), as described above, and the second plasma potential ($V_{p,2}$) should be stable with substantially reduced or minimal fluctuations if any fluctuations at all. To achieve this stability in the second plasma 22, the second plasma chamber 20 comprises a DC conductive bias electrode 24 having a conductive surface in contact with the second plasma 22, wherein the DC conductive bias electrode 24 is coupled to a DC voltage source 26. The DC voltage source 26 is configured to bias the DC conductive bias electrode 24 at a positive DC voltage ($+V_{DC}$). As a result, the second plasma potential ($V_{p,2}$) is a boundary-driven plasma potential driven by a ($+V_{DC}$) voltage source, thus causing $V_{p,2}$ to rise to about $+V_{DC}$ and remain substantially stable. Although one DC conductive bias electrode 24 is shown in FIG. 1A, the chemical processing system 1 may comprise one or more DC conductive bias electrodes.

Furthermore, the plasma processing system comprises a separation member 30 disposed between the first plasma chamber 10 and the second plasma chamber 20. The separation member 30 may act as an electron diffuser. The electron diffusion is driven by an electric field through an electron acceleration layer created by the potential difference $\Delta V = V_{p,2} - V_{p,1}$. The separation member 30 may comprise an insulator, such as quartz or alumina, or the separation member 30 may comprise a dielectric coated conductive material that is electrically floating and has a high RF impedance to ground. Due to the large electric field across the electron acceleration layer ($\nabla_z(V_{p,2} - V_{p,1})$), the electron flux is sufficiently energetic to sustain ionization in the second plasma 22. However, the chemical processing system 1 may optionally comprise a plasma heating system configured to further heat the second plasma 22.

The separation member 30 may comprise one or more openings to permit the passage of the energetic electron flux from the first plasma chamber 10 to the second plasma chamber 20. The total area of the one or more openings can be adjusted relative to the surface area of the DC conductive ground electrode 14 to ensure a relatively large potential difference $\Delta V = V_{p,2} - V_{p,1}$ while minimizing reverse ion current from the second plasma 22 to the first plasma 12, and thereby ensure a sufficient ion energy for ions striking the substrate 25.

As illustrated in FIG. 1A, a first ion flux (e.g., ion current, $j_{i1}$) from a first population of ions in the first plasma 12 flows to the DC conductive ground electrode 14 in the first plasma chamber 10 in a quantity approximately equivalent to the energetic electron flux (or electron current $j_{ee}$) from the first plasma 12 through the electron acceleration layer at the separation member 30 into the second plasma 22, i.e., $j_{i1} \sim j_{ee}$.

As described above, the energetic electron flux is sufficiently energetic to form the second plasma 22. Therein, a population of thermal electrons and a second population of ions are formed. The thermal electrons are largely a result of ejected electrons upon ionization of the second plasma 22 by the incoming energetic electron flux (or electron current $j_{ee}$). However, some energetic electrons from the energetic electron flux may lose a sufficient amount of energy and, thus, become part of the thermal electron population.

Due to Debye shielding, only the thermal electrons of the second plasma 22 flow to the DC conductive bias electrode 24 (e.g., thermal electron current, $j_{te}$) in a quantity approximately equal to the energetic electron flux, i.e., $j_{te} \sim j_{ee}$. While thermal electron current $j_{te}$ is directed to the DC conductive bias electrode 24, a second ion flux from the second population of ions is directed to the substrate at $V_{p,2}$ (as ion current, $j_{i2}$).

If the incoming energetic electron energy is sufficiently high, a substantial fraction of the energetic electron flux ($j_{ee}$) will survive the passage through the second plasma 22 and strike wafer 25. However, regardless of their origin (i.e., energetic electrons from energetic electron flux $j_{ee}$ or energetic electrons from the thermal electron population), only energetic electrons capable of passing through the substrate sheath (i.e. climbing the potential "hill") will reach substrate 25. Since substrate 25 is at floating DC ground, the ion current $j_{i2}$ that is fed by the second ion population in the second plasma 22 will be equivalent to the electron current $j_{e2}$ (i.e., no net current, or $j_{i2} \sim j_{e2}$). Alternatively, the substrate 25 may be at approximately DC ground since the floating-ground surface potential is expected to be slightly above DC ground.

In such a configuration for the chemical processing system 1, the elevation of the second plasma potential above the first plasma potential drives an energetic electron beam (having electron current $j_{ee}$) to form the second plasma 22, while particle balance throughout the chemical processing system 1 enforces an equal number of electrons (e.g., electron current, $j_{e2}$) and ions (e.g., ion current, $j_{i2}$) striking substrate 25 (i.e., $j_{i2} \sim j_{e2}$). This charge balance manifests as a space-charge neutralized neutral beam directed to substrate 25 that activates a chemical process at substrate 25.

Figure 2:
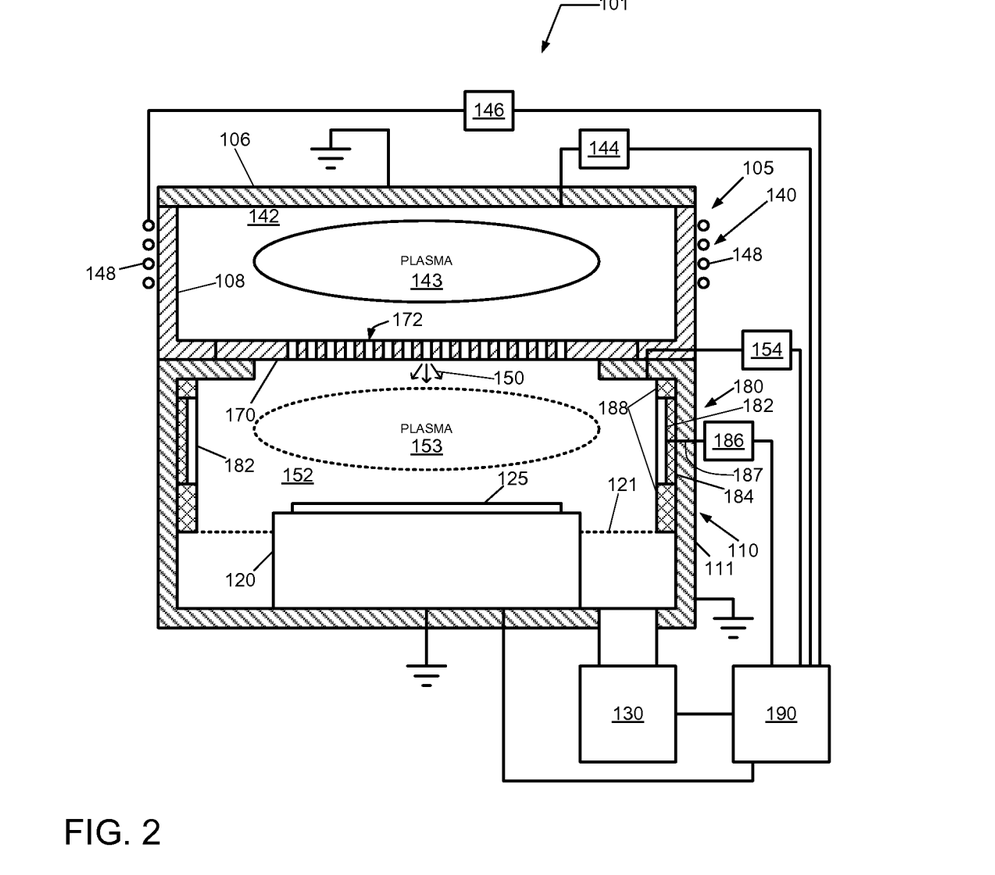
FIG. 2 shows a chemical processing system according to an embodiment.

Referring now to FIG. 2, a chemical processing system 101 is provided according to an embodiment. The chemical processing system 101 comprises a plasma generation chamber 105 configured to produce a first plasma 143 at a first plasma potential, and a process chamber 110 configured to provide a contaminant-free, vacuum environment for plasma processing of a substrate 125. The process chamber 110 comprises a substrate holder 120 configured to support substrate 125, and a vacuum pumping system 130 coupled to the process chamber 110 and configured to evacuate the process chamber 110 and control a pressure in the process chamber 110.

The plasma generation chamber 105 comprises a first plasma region 142 configured to receive a first process gas at a first pressure and form the first plasma 143. Furthermore, the process chamber 110 comprises a second plasma region 152 disposed downstream of the first plasma region 142 and configured to receive electron flux 150 and the first process gas from the first plasma region 142 and form a second plasma 153 therein at a second plasma potential and a second pressure.

A first gas injection system 144 is coupled to the plasma generation chamber 105, and configured to introduce the first process gas to the first plasma region 142. The first process gas may comprise an electropositive gas or an electronegative gas or a mixture thereof. For example, the first process gas may comprise a noble gas, such as argon (Ar). Additionally, for example, the first process gas may comprise any gas suitable for treating substrate 125. Furthermore, for example, the first process gas may comprise any gas having chemical constituents, atomic or molecular, suitable for treating substrate 125. These chemical constituents may comprise etchants, film forming gases, dilutants, cleaning gases, etc. The first gas injection system 144 may include one or more gas supplies or gas sources, one or more control valves, one or more filters, one or more mass flow controllers, etc.

An optional second gas injection system 154 may be coupled to the process chamber 110, and configured to introduce a second process gas to the second plasma region 152. The second process gas may comprise any gas suitable for treating substrate 125. Additionally, for example, the second process gas may comprise any gas having chemical constituents, atomic or molecular, suitable for treating substrate 125. These chemical constituents may comprise etchants, film forming gases, dilutants, cleaning gases, etc. The second gas injection system may include one or more gas supplies or gas sources, one or more control valves, one or more filters, one or more mass flow controllers, etc.

Referring still to FIG. 2, the chemical processing system 101 comprises a plasma generation system 140 coupled to the plasma generation chamber 105 and configured to generate the first plasma 143 in the first plasma region 142. The plasma generation system 140 can comprise a system configured to produce a capacitively coupled plasma (CCP), an inductively coupled plasma (ICP), a transformer coupled plasma (TCP), a surface wave plasma, a helicon wave plasma, or an electron cyclotron resonant (ECR) heated plasma, or other type of plasma understood by one skilled in the art of plasma formation. Although the first plasma may be heated by any plasma source, it is desired that the first plasma is heated by a method that produces a minimum fluctuation in its plasma potential $V_{p,1}$. For example, an ICP source is a practical technique that produces a reduced or minimum $V_{p,1}$ fluctuation.

As shown in FIG. 2, the plasma generation system 140 may comprise an inductive coil 148 which is coupled to a power source 146. The power source 146 may comprise a radio frequency (RF) generator that couples RF power through an optional impedance match network to inductive coil 148. RF power is inductively coupled from inductive coil 148 through a dielectric window 108 to the first plasma 143 in the first plasma region 142. A typical frequency for the application of RF power to the inductive coil can range from about 10 MHz to about 100 MHz. In addition, a slotted Faraday shield (not shown) can be employed to reduce capacitive coupling between the inductive coil 148 and plasma.

An impedance match network may serve to improve the transfer of RF power to plasma by reducing the reflected power. Match network topologies (e.g. L-type, π-type, T-type, etc.) and automatic control methods are well known to those skilled in the art.

As an example, in an electropositive discharge, the electron density may range from approximately $10^{10}$ cm$^{-3}$ to $10^{13}$ cm$^{-3}$, and the electron temperature may range from about 1 eV to about 10 eV (depending on the type of plasma source utilized).

Additionally, as shown in FIG. 2, the plasma generation chamber 105 comprises a direct current (DC) conductive electrode 106 having a conductive surface that acts as a boundary in contact with the first plasma 143. The DC conductive ground electrode 106 is coupled to DC ground. For example, the DC conductive ground electrode 106 may comprise a doped silicon electrode. The DC conductive ground electrode 106 acts as an ion sink that is driven by the first plasma 143 at the first plasma potential ($V_{p,1}$). Although one DC conductive ground electrode 106 is shown in FIG. 2, the chemical processing system 101 may comprise one or more DC conductive ground electrodes.

Although not necessary, it is desirable that the DC conductive ground electrode 106 comprises a relatively large area in contact with the first plasma 143. The larger the area at DC ground, the lower the first plasma potential. For example, the surface area of the conductive surface for the DC conductive ground electrode 106 in contact with the first plasma 143 may be greater than any other surface area in contact with the first plasma 143. Additionally, for example, the surface area of the conductive surface for the DC conductive ground electrode 106 in contact with the first plasma 143 may be greater than the total sum of all other conductive surfaces that are in contact with the first plasma 143. Alternatively, as an example, the conductive surface for the DC conductive ground electrode 106 in contact with the first plasma 143 may be the only conductive surface that is in contact with the first plasma 143. The DC conductive ground electrode 106 may offer the lowest impedance path to ground.

Referring still to FIG. 2, the chemical processing system 101 further comprises a bias electrode system 180 coupled to the process chamber 110. The electrode bias system 180 is configured to elevate the second plasma potential to a value above the first plasma potential in order to drive the electron flux. The bias electrode system 180 comprises a DC conductive bias electrode 182 having a conductive surface in contact with the second plasma 153. The DC conductive bias electrode 182 is electrically insulated from the process chamber 110 via insulator 184 and the DC conductive bias electrode 182 is coupled to a DC voltage source 186. The conductive bias electrode 182 is composed of a conductive material, such as a metal or doped silicon. Although one DC conductive bias electrode 182 is shown in FIG. 2, the chemical processing system 101 may comprise one or more DC conductive bias electrodes.

Although not necessary, it is desirable that the DC conductive bias electrode 182 comprises a relatively large area in contact with the second plasma 153. The larger the area at +$V_{DC}$, the closer the second plasma potential will be to +$V_{DC}$. As an example, the total area of the DC conductive bias electrode 182 may be greater than the total sum of all other conductive surfaces that are in contact with the second plasma 153. Alternatively, as an example, the total area of the DC conductive bias electrode 182 may be the only conductive surface that is in contact with the second plasma 153.

The voltage source 186 can include a variable DC power supply. Additionally, the DC voltage source 186 can include a bipolar DC power supply. The DC voltage source 186 can further include a system configured to perform at least one of monitoring adjusting, or controlling the polarity, current, voltage, or on/off state of the DC voltage source 186. An electrical filter may be utilized to de-couple RF power from the DC voltage source 186.

For example, the DC voltage applied to the DC conductive bias electrode 182 by DC voltage source 186 may range from approximately 0 volts (V) to approximately 10000 V. Desirably, the DC voltage applied to the DC conductive bias electrode 182 by DC voltage source 186 may range from approximately 50 volts (V) to approximately 5000 V. Additionally, it is desirable that the DC voltage has a positive polarity. Furthermore, it is desirable that the DC voltage is a positive voltage having an absolute value greater than approximately 50 V.

As shown in FIG. 2, the process chamber 110 comprises a chamber housing member 111 that may be coupled to ground. Additionally, a liner member 188 may be disposed between the chamber housing member 111 and the second plasma 153. The liner member 188 may be fabricated from a dielectric material, such as quartz or alumina. The liner member 188 may provide a high RF impedance to ground for the second plasma 153. Further, an electrical feed-through 187 is configured to allow electrical connection to the DC conductive bias electrode 182.

Referring still to FIG. 2, a separation member 170 is disposed between the first plasma region 142 and the second plasma region 152, wherein the separation member 170 comprises one or more openings 172 configured to allow passage of the first process gas as well as electron flux 150 from the first plasma 143 in the first plasma region 142 to the second plasma region 152 in order to form the second plasma 153 in the second plasma region 152.

The one or more openings 172 in the separation member 170 may comprise super-Debye length apertures, i.e., the transverse dimension or diameter is larger than the Debye length. The one or more openings 172 may be sufficiently large to permit adequate electron transport, and the one or more openings 172 may be sufficiently small to allow a sufficiently high potential difference between the first plasma potential and the second plasma potential and to reduce any reverse ion current between the second plasma 153 and the first plasma 143. Further, the one or more openings 172 may be sufficiently small to sustain a pressure difference between the first pressure in the first plasma region 142 and the second pressure in the second plasma region 152.

Although the DC conductive ground electrode 106 is coupled to DC ground, it may be coupled to a DC voltage less than the bias DC voltage coupled to the DC conductive bias electrode 182.

As illustrated in FIG. 2, electron flux 150 occurs between the first plasma region 142 and the second plasma region 152 through separation member 170. The electron transport is driven by electric field-enhanced diffusion, wherein the electric field is established by the potential difference between the first plasma potential and the second plasma potential. The electron flux 150 is sufficiently energetic to sustain ionization in the second plasma 153.

Vacuum pumping system 130 may, for example, include a turbo-molecular vacuum pump (TMP) capable of a pumping speed up to 5000 liters per second (and greater) and a vacuum valve (or second vacuum valve), such as a gate valve, for controlling the pressure in the second plasma region 152. Furthermore, a device for monitoring chamber pressure (not shown) can be coupled to the process chamber 110. The pressure measuring device may be, for example, a Type 628B Baratron absolute capacitance manometer commercially available from MKS Instruments, Inc. (Andover, Mass.).

Referring still to FIG. 2, the substrate holder 120 can be coupled to ground. If the substrate holder 120 is coupled to ground, the substrate 125 may be at floating ground and, therefore, the only ground the second plasma 153 contacts is the floating ground provided by substrate 125. For example, when the substrate 125 is clamped to substrate holder 120, a ceramic electrostatic clamp (ESC) layer may insulate the substrate 125 from the grounded substrate holder 120.

Alternatively, the chemical processing system 101 may comprise a substrate bias system coupled to substrate holder 120 and configured to electrically bias substrate 125. For example, the substrate holder 120 may include an electrode that is coupled to a RF generator through an optional impedance match network. A typical frequency for the application of power to the substrate holder 120 may range from about 0.1 MHz to about 100 MHz.

Referring still to FIG. 2, chemical processing system 101 may comprise a substrate temperature control system coupled to the substrate holder 120 and configured to adjust and control the temperature of substrate 125. The substrate temperature control system comprises temperature control elements, such as a cooling system including a recirculating coolant flow that receives heat from substrate holder 120 and transfers heat to a heat exchanger system (not shown), or when heating, transfers heat from the heat exchanger system. Additionally, the temperature control elements can include heating/cooling elements, such as resistive heating elements, or thermo-electric heaters/coolers, which can be included in the substrate holder 120, as well as the chamber wall of the process chamber 110 and any other component within the chemical processing system 101.

In order to improve the thermal transfer between substrate 125 and substrate holder 120, substrate holder 120 can include a mechanical clamping system, or an electrical clamping system, such as an electrostatic clamping (ESC) system, to affix substrate 125 to an upper surface of substrate holder 120. Furthermore, substrate holder 120 can further include a substrate backside gas delivery system configured to introduce gas to the back-side of substrate 125 in order to improve the gas-gap thermal conductance between substrate 125 and substrate holder 120. Such a system can be utilized when temperature control of the substrate is required at elevated or reduced temperatures. For example, the substrate backside gas system can comprise a two-zone gas distribution system, wherein the helium gas gap pressure can be independently varied between the center and the edge of substrate 125.

As shown in FIG. 2, the substrate holder 120 may be surrounded by a baffle member 121 that extends beyond a peripheral edge of the substrate holder 120. The baffle member 121 may serve to homogeneously distribute the pumping speed delivered by the vacuum pumping system 130 to the second plasma region 152. The baffle member 121 may be fabricated from a dielectric material, such as quartz, or alumina. The baffle member 121 may provide a high RF impedance to ground for the second plasma 153.

Referring still to FIG. 2, chemical processing system 101 can further comprise a controller 190. Controller 190 comprises a microprocessor, memory, and a digital I/O port capable of generating control signals sufficient to communicate and activate inputs to chemical processing system 101 as well as monitor outputs from chemical processing system 101. Moreover, controller 190 can be coupled to and can exchange information with plasma generation system 140 including first gas injection system 144 and power source 146, electrode bias system 180 including optional second gas injection system 154 and DC voltage source 186, substrate holder 120, and vacuum pumping system 130. For example, a program stored in the memory can be utilized to activate the inputs to the aforementioned components of chemical processing system 101 according to a process recipe in order to perform the method of treating substrate 125.

However, the controller 190 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 190 includes at least one computer readable medium or memory, such as the controller memory, for holding instructions programmed according to the teachings of the invention and for containing data structures, tables, records, or other data that may be necessary to implement the present invention.

The term "computer readable medium" as used herein refers to any medium that participates in providing instructions to the processor of the controller 190 for execution. A computer readable medium may take many forms, including but not limited to, non-volatile media, volatile media, and transmission media. Non-volatile media includes, for example, optical, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to processor of controller for execution. For example, the instructions may initially be carried on a magnetic disk of a remote computer. The remote computer can load the instructions for implementing all or a portion of the present invention remotely into a dynamic memory and send the instructions over a network to the controller 190.

Stored on any one or on a combination of computer readable media, the invention includes software for controlling the controller 190, for driving a device or devices for implementing the invention, and/or for enabling the controller to interact with a human user. Such software may include, but is not limited to, device drivers, operating systems, development tools, and applications software. Such computer readable media further includes the computer program product of the invention for performing all or a portion (if processing is distributed) of the processing performed in implementing the invention.

The computer code devices may be any interpretable or executable code mechanism, including but not limited to, scripts, interpretable programs, dynamic link libraries (DLLs), Java classes, and complete executable programs. Moreover, parts of the processing may be distributed for better performance, reliability, and/or cost.

Controller 190 may be locally located relative to the chemical processing system 101, or it may be remotely located relative to the chemical processing system 101 via an internet or intranet. Thus, controller 190 can exchange data with the chemical processing system 101 using at least one of a direct connection, an intranet, or the internet. Controller 190 may be coupled to an intranet at a customer site (i.e., a device maker, etc.), or coupled to an intranet at a vendor site (i.e., an equipment manufacturer). Furthermore, another computer (i.e., controller, server, etc.) can access controller 190 to exchange data via at least one of a direct connection, an intranet, or the internet.

Figure 3:
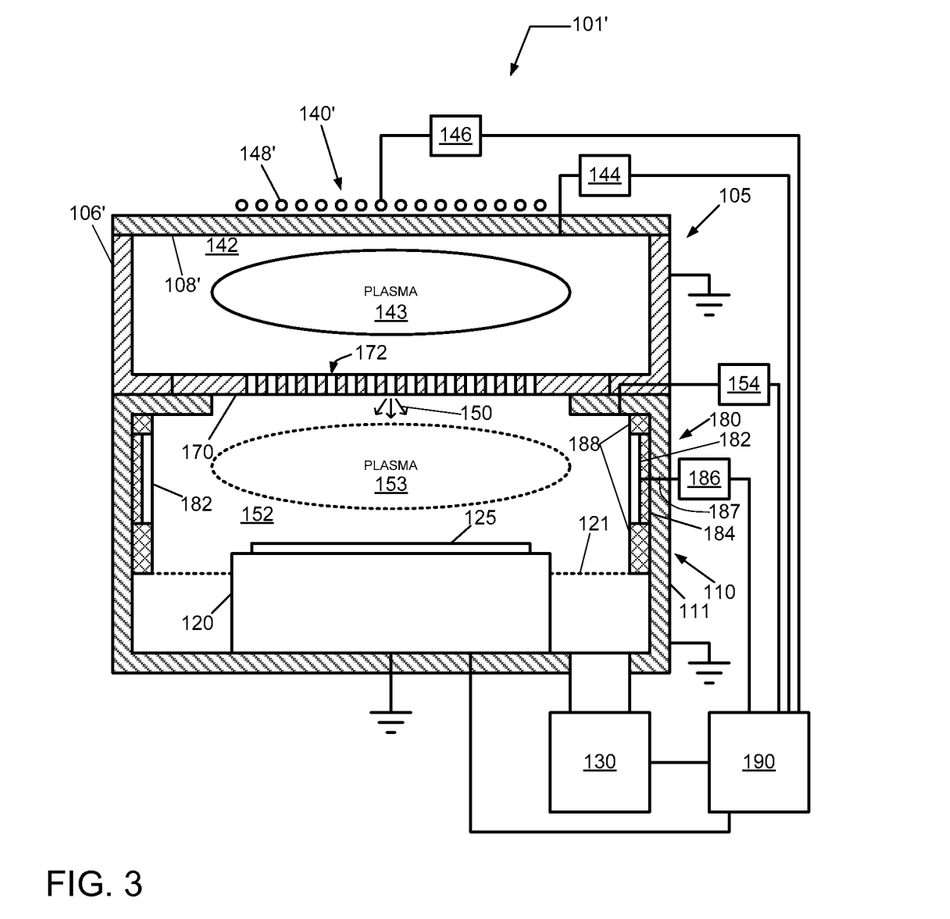
FIG. 3 shows a chemical processing system according to another embodiment.

Referring now to FIG. 3, a chemical processing system 101' is provided according to another embodiment. The chemical processing system 101' comprises like components as in the chemical processing system 101 depicted in FIG. 2. However, chemical processing system 101' comprises a plasma generation system 140' having an inductive coil 148' located above the plasma generation chamber 105. The inductive coil 148' may be a planar coil, such as a "spiral" coil or "pancake" coil, in communication with the plasma from above as in a transformer coupled plasma (TCP). RF power is inductively coupled from inductive coil 148' through a dielectric window 108' to the first plasma 143 in the first plasma region 142. The design and implementation of an ICP source, or TCP source, is well known to those skilled in the art.

Additionally, as shown in FIG. 3, the plasma generation chamber 105 comprises a direct current (DC) conductive ground electrode 106' having a conductive surface that acts as a boundary in contact with the first plasma 143. The at least one DC conductive ground electrode 106' is coupled to DC ground.

Figure 4:
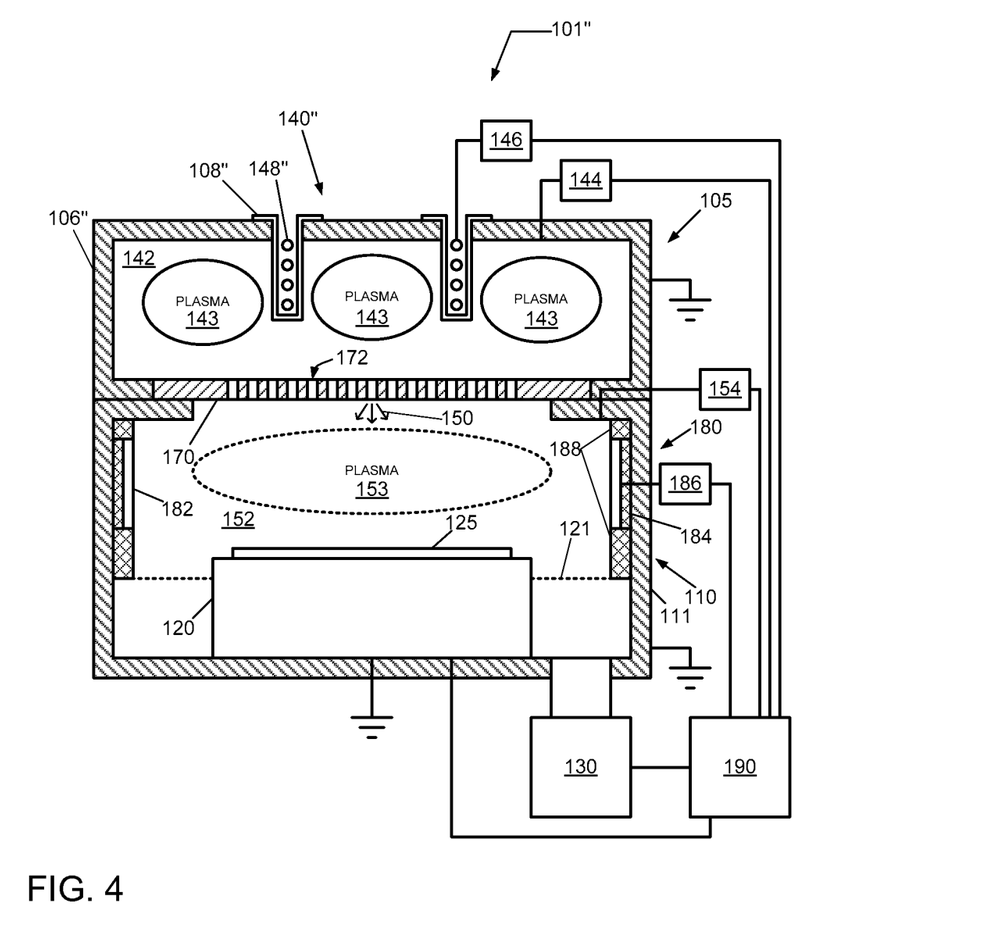
FIG. 4 shows a chemical processing system according to another embodiment.

Referring now to FIG. 4, a chemical processing system 101" is provided according to another embodiment. The chemical processing system 101" comprises like components as in the chemical processing system 101 depicted in FIG. 2. However, chemical processing system 101" comprises a plasma generation system 140" having an inductive coil 148" located within the first plasma region 142 of the plasma generation chamber 105, wherein the inductive coil 148" is separated from the first plasma 143 by a cylindrical dielectric window insert 108". The inductive coil 148" may be a cylindrical coil, such as a helical coil, that is coupled to power source 146. RF power may be inductively coupled from inductive coil 148" through the cylindrical dielectric window insert 108" to the first plasma 143 in the first plasma region 142. The design and implementation of an ICP source is well known to those skilled in the art.

Additionally, as shown in FIG. 4, the plasma generation chamber 105 comprises a direct current (DC) conductive ground electrode 106" having a conductive surface that acts as a boundary in contact with the first plasma 143. The DC conductive ground electrode 106" is coupled to DC ground. As shown in FIG. 4, since the inductive coil 148" is immersed within the first plasma 143, the DC conductive ground electrode 106" comprises a surface area that occupies a substantial fraction of the interior surfaces of the plasma generation chamber 105.

Figure 5:
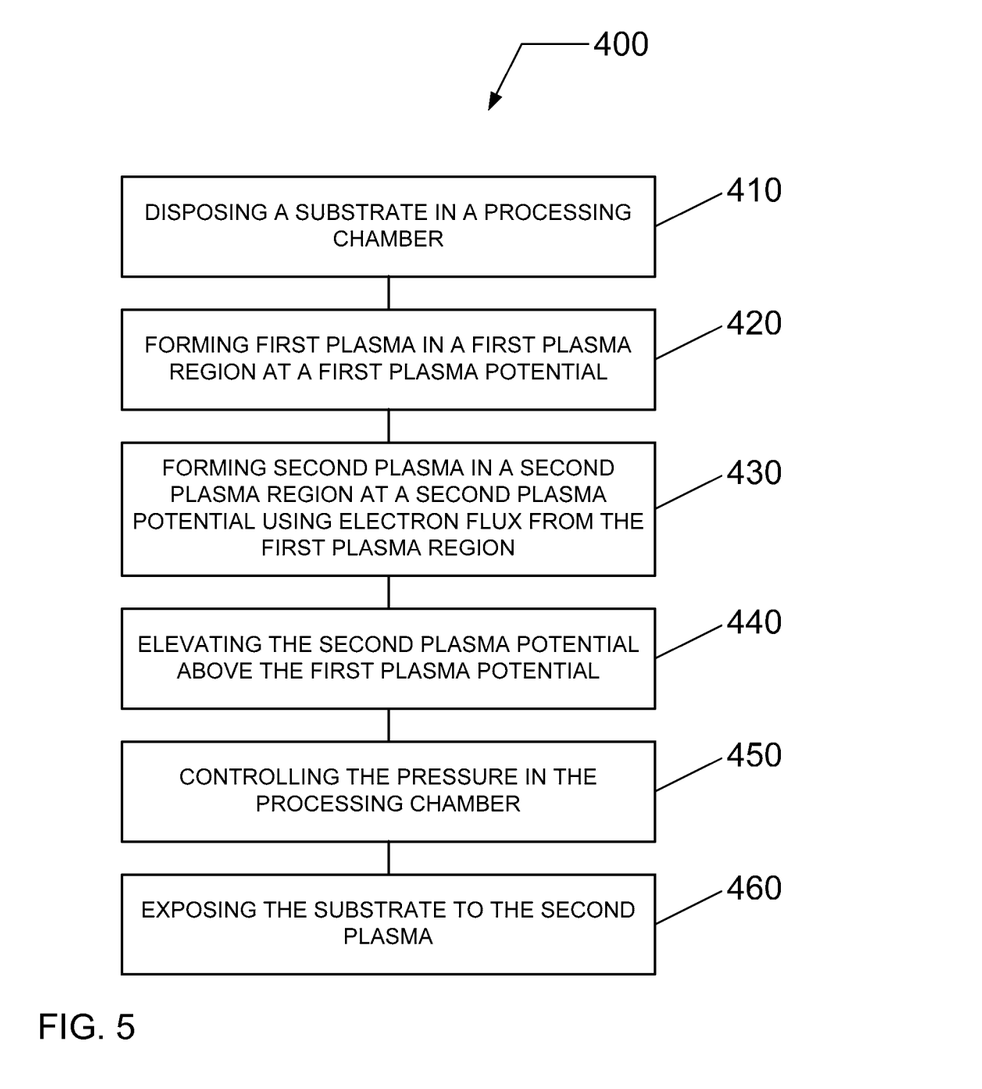
FIG. 5 illustrates a method of operating a plasma processing system configured to treat a substrate according to another embodiment.

Referring now to FIG. 5, a flow chart 400 is provided of a method for operating a plasma processing system to treat a substrate according to an embodiment of the invention. Flow chart 400 begins in 410 with disposing a substrate in a plasma processing system configured to facilitate the treatment of the substrate using plasma. The plasma processing chamber may include components of any one of the plasma processing systems described in FIGS. 1A, 1B, 2, 3 and 4.

In 420, a first plasma is formed from a first process gas in a first plasma region at a first plasma potential. As illustrated in FIGS. 1A, 1B, 2, 3 and 4, the first plasma region may be located in a plasma generation chamber, and a plasma generation system may be coupled to the plasma generation chamber in order to form the first plasma.

In 430, a second plasma is formed in a second plasma region at a second plasma potential using electron flux from the first plasma. Electron flux from the first plasma in the first plasma region passes from the plasma generation chamber through a separation member to a process chamber where the substrate is to be treated. As illustrated in FIGS. 1A, 1B, 2, 3 and 4, the second plasma region may be located in a process chamber, wherein one or more openings or passages in the separation member disposed between the plasma generation chamber and the process chamber facilitate the transport or supply of electrons from the first plasma region to the second plasma region.

In 440, the second plasma potential is elevated above the first plasma potential to control the electron flux. The first plasma in the first plasma region may be a boundary-driven plasma (i.e., the plasma boundary has a substantive influence on the respective plasma potential), wherein part or all of the boundary in contact with the first plasma is coupled to DC ground. Additionally, the second plasma in the second plasma region may be a boundary-driven plasma, wherein part or all of the boundary in contact with the second plasma is coupled to a DC voltage source at $+V_{DC}$. The elevation of the second plasma potential above the first plasma potential may be performed using any one or combination of the embodiments provided in FIGS. 1A, 1B, 2, 3 and 4.

In 450, gases entering the process chamber are pumped by a vacuum pumping system to control a pressure in the process chamber. In 460, the substrate is exposed to the second plasma in the second plasma region. The exposure of the substrate to the second plasma may comprise exposing the substrate to a mono-energetic space-charge neutralized neutral beam activated chemical process.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A chemical processing system configured to treat a substrate, comprising:
   a first plasma chamber for forming a first plasma at a first plasma potential, the first plasma chamber including a direct current (DC) conductive ground electrode positioned on top of a dielectric window that forms a sidewall on each side of the first plasma chamber, the DC conductive ground electrode coupled to ground and being in contact with the first plasma and maintained at a potential with respect to the first plasma potential such that the DC conductive ground electrode sinks an ion flux from the first plasma to lower said first plasma potential;
   a second plasma chamber for forming a second plasma at a second potential, and having a sidewall comprising a DC conductive bias electrode coupled to a variable DC voltage source, the second plasma chamber including:

(i) a chamber housing member that is fabricated from a DC conductive material and is coupled to DC ground, (ii) a liner member coupled to said chamber housing member that is fabricated from a dielectric material and is configured to electrically insulate said chamber housing member from said second plasma, (iii) an electrical feed-through that is configured to allow electrical connection to the DC conductive bias electrode, and (iv) an electrode insulator disposed between the DC conductive bias electrode and said chamber housing member and configured to electrically insulate the DC conductive bias electrode from said chamber housing member;

a substrate holder configured to support the substrate in said second plasma chamber;

a separation member disposed between said first plasma chamber and said second plasma chamber, wherein said separation member is made from a dielectric material such that the first and second plasmas can be maintained at different plasma potentials, the separation member comprising one or more openings having a diameter greater than a Debye length to allow an electron flux to flow from said first plasma through the separation member to said second plasma; and a controller coupled to said variable DC voltage source and programmed to maintain said DC conductive bias electrode at a voltage potential that is positive relative to the second plasma potential such that the DC conductive bias electrode sinks electrons from the second plasma and elevates said second plasma potential above said first plasma potential in order to control said electron flux from said first plasma to sustain said second plasma.

2. The chemical processing system of claim 1, wherein said first plasma is driven by a first boundary at DC ground voltage, and wherein said second plasma is driven by a second boundary at a DC bias voltage.

3. The chemical processing system of claim 1, wherein the DC conductive ground electrode of the first plasma chamber comprises a conductive surface in contact with said first plasma.

4. The chemical processing system of claim 3, wherein said conductive surface has a surface having a surface area in contact with said first plasma which is greater than any other surface area in contact with said first plasma.

5. The chemical processing system of claim 3, wherein the DC conductive ground electrode comprises a doped silicon electrode.

6. The chemical processing system of claim 1, wherein the DC conductive bias electrode comprises a DC conductive surface in contact with said second plasma.

7. The chemical processing system of claim 6, wherein said DC conductive surface has a surface area in contact with said second plasma greater than any other surface area in contact with said second plasma.

8. The chemical processing system of claim 1, wherein the DC conductive bias electrode comprises a doped silicon electrode.

9. The chemical processing system of claim 1, wherein said variable DC voltage source is configured to bias the DC conductive bias electrode with a DC voltage ranging from about 50 V to about 5000V.

10. The chemical processing system of claim 1, further comprising:

a first gas injection system coupled to said first plasma chamber and configured to introduce a first process gas to said first plasma chamber; and a plasma generation system coupled to said first plasma chamber and configured to generate said first plasma from said first process gas.

11. The chemical processing system of claim 10, further comprising:

a second gas injection system coupled to said second plasma chamber and configured to introduce a second process gas to said second plasma chamber.

12. The chemical processing system of claim 10, wherein said plasma generation system comprises a capacitively coupled plasma (CCP) source, an inductively coupled plasma (ICP) source, a transformer coupled plasma (TCP) source, a surface wave plasma source, a helicon wave plasma source, or an electron cyclotron resonance (ECR) plasma source, or a combination of two or more thereof.

13. The chemical processing system of claim 12, wherein said plasma generation system comprises an inductive coil configured to inductively couple power from a power source to said first process gas in a first plasma region.

14. The chemical processing system claim 10, further comprising a vacuum pumping system coupled to said second plasma chamber and configured to pump a second plasma region in said second plasma chamber.

15. The chemical processing system of claim 14, wherein said controller is coupled to said plasma generation system, said DC conductive bias electrode, said first plasma chamber, said first gas injection system, said substrate holder, and said vacuum pumping system, and said controller is configured to adjust or control said second plasma by varying at least one of a power coupled by said plasma generation system to said first process gas in said first plasma chamber, a DC voltage coupled to said second plasma by said DC bias electrode, a composition of said first process gas coupled to said first plasma chamber, a flow rate of said first process gas coupled to said first plasma chamber, a pumping speed coupled to said second plasma chamber, a temperature of said substrate, or a combination of two or more thereof.

16. The chemical processing system of claim 15, wherein said vacuum pumping system maintains said second plasma chamber at a lower pressure than said first plasma chamber.

17. The chemical processing system of claim 1, wherein said substrate holder is coupled to DC ground, and wherein said substrate is at DC ground or floating ground.

18. The chemical processing system of claim 1, further comprising a vacuum pumping system coupled to said second plasma chamber and configured to pump a second plasma region in said second plasma chamber.

19. The chemical processing system of claim 18, wherein said vacuum pumping system maintains said second plasma chamber at a lower pressure than said first plasma chamber.

20. The chemical processing system of claim 1, wherein the separation member is positioned between each side of the dielectric window such that the DC conductive ground electrode, the dielectric window, and the separation chamber form the first plasma chamber as a closed chamber except for the one or more openings of the separation chamber.

\* \* \* \* \*

UNITED STATES PATENT AND TRADEMARK OFFICE
CERTIFICATE OF CORRECTION

PATENT NO. : 10,734,200 B2
APPLICATION NO. : 15/352339
DATED : August 4, 2020
INVENTOR(S) : Lee Chen Page 1 of 1

It is certified that error appears in the above-identified patent and that said Letters Patent is hereby corrected as shown below:

In the Claims

In Column 13, Line 63, Claim 9, delete "5000V." and insert -- 5000 V. --, therefor.

In Column 14, Line 26, Claim 14, delete "The chemical processing system claim" and insert -- The chemical processing system of claim --, therefor.

Signed and Sealed this
Nineteenth Day of January, 2021

Andrei Iancu
*Director of the United States Patent and Trademark Office*